(12) United States Patent
Yen et al.

(10) Patent No.: US 11,587,884 B2
(45) Date of Patent: Feb. 21, 2023

(54) PATTERNED GROUND SHIELD DEVICE INCLUDING MULTIPLE PATTERED GROUND SHIELD LAYERS

(71) Applicant: Realtek Semiconductor Corporation, Hsinchu (TW)

(72) Inventors: Hsiao-Tsung Yen, Hsinchu (TW); Sheng-Hung Lin, Hsinchu (TW); Han-Chang Kang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/351,387

(22) Filed: Jun. 18, 2021

(65) Prior Publication Data
US 2022/0230968 A1 Jul. 21, 2022

(30) Foreign Application Priority Data
Jan. 20, 2021 (TW) ................................. 110102206

(51) Int. Cl.
*H01L 23/552* (2006.01)
(52) U.S. Cl.
CPC ................................. *H01L 23/552* (2013.01)
(58) Field of Classification Search
CPC .................................................... H01L 23/552
USPC ........................................................ 257/659
See application file for complete search history.

(56) References Cited

U.S. PATENT DOCUMENTS

| | | | |
|---|---|---|---|
| 9,780,162 B2 | 10/2017 | Yen et al. | |
| 9,883,590 B2 | 1/2018 | Huang et al. | |
| 10,134,684 B2 | 11/2018 | Yen et al. | |
| 2008/0029854 A1* | 2/2008 | Hung | H01L 23/5225 257/659 |
| 2017/0076857 A1* | 3/2017 | Huang | H01F 27/363 |
| 2017/0365560 A1* | 12/2017 | Yen | H01L 23/552 |
| 2018/0374798 A1* | 12/2018 | Lee | H01L 23/49811 |
| 2019/0393148 A1* | 12/2019 | Uchida | H01L 23/5227 |
| 2021/0090988 A1 | 3/2021 | Yen et al. | |

FOREIGN PATENT DOCUMENTS

TW 201135912 A 10/2011

OTHER PUBLICATIONS

U.S. Appl. No. 17/034,207, filed Sep. 28, 2020.

* cited by examiner

*Primary Examiner* — Didarul A Mazumder
(74) *Attorney, Agent, or Firm* — Locke Lord LLP; Tim Tingkang Xia, Esq.

(57) ABSTRACT

A patterned ground shield device includes a first patterned ground shield layer and a second patterned ground shield layer. The first patterned ground shield layer is located on a first layer, and the second patterned ground shield layer is located on a second layer. The first patterned ground shield layer includes a plurality of first strip-shaped structures, and each of the first strip-shaped structures includes an oxide diffusion material. The second patterned ground shield layer includes a plurality of second strip-shaped structures, and each of the second strip-shaped structures includes a conductive material, wherein the first strip-shaped structures and the second strip-shaped structures are disposed to each other in an interlaced manner.

18 Claims, 4 Drawing Sheets

PATTERNED GROUND SHIELD DEVICE INCLUDING MULTIPLE PATTERED GROUND SHIELD LAYERS

RELATED APPLICATIONS

This application claims priority to and the benefit of Taiwan Application Serial Number 110102206, filed on Jan. 20, 2021, the entire contents of which are incorporated herein by reference as if fully set forth below in its entirety and for all applicable purposes.

BACKGROUND

Field of Invention

The present disclosure relates to an electronic device. More particularly, the present disclosure relates to a patterned ground shield device.

Description of Related Art

With the development of integrated circuits, sizes of electrical elements in integrated circuits become smaller. However, when sizes of electrical elements become smaller, many negative effects occur. For example, when inductors operate, eddy currents formed on substrates will affect Q value of inductors. Inductors occupy a great deal of area in integrated circuits (IC), and there are pattern ground shields (PGS) disposed below the inductors. The rest space between the inductors and the PGS in the IC cannot dispose other elements, or the PGS cannot perform its function in the IC. Therefore, area utilization rate in the IC is low.

For the foregoing reasons, there is a need to solve the above-mentioned problems by providing a pattern ground shield device, which satisfies the needs for high Q value and area saving in the IC, when electrical elements are disposed below the PGS.

SUMMARY

The foregoing presents a simplified summary of the disclosure in order to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

One aspect of the present disclosure is to provide a patterned ground shield device. The patterned ground shield device includes a first patterned ground shield layer and a second patterned ground shield layer. The first patterned ground shield layer is located on a first layer, and the second patterned ground shield layer is located on a second layer. The first patterned ground shield layer includes a plurality of first strip-shaped structures, and each of the first strip-shaped structures includes an oxide diffusion material. The second patterned ground shield layer includes a plurality of second strip-shaped structures, and each of the second strip-shaped structures includes a conductive material, wherein the first strip-shaped structures and the second strip-shaped structures are disposed to each other in an interlaced manner.

Therefore, based on the technical content of the present disclosure, the patterned ground shield device of the embodiment of the present disclosure may restrain eddy currents generated on the substrate so as to enhance quality factor of the integrated inductor. The principle of the present disclosure is to use the original pattern ground shield (PGS) to be a first protection in a form of a layer. In addition, the present disclosure further constructs a second PGS at the lower layer to be a second protection in a form of a layer, so as to further prevent eddy currents from generating on the substrate owing to the magnetic field.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

According to the usual mode of operation, various features and elements in the figures have not been drawn to scale, which are drawn to the best way to present specific features and elements related to the disclosure. In addition, among the different figures, the same or similar element symbols refer to similar elements/components.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

In an integrated inductor, if there is no patterned ground shield (PGS) which is disposed between a substrate and an inductor, eddy currents are generated on a substrate owing to the magnetic field produced by the inductor of the integrated inductor when operating. Therefore, Q value of the integrated inductor will be affected. For solving the problem as shown above, the present disclosure provides a patterned ground shield device, which will be described below.

Figure 1:
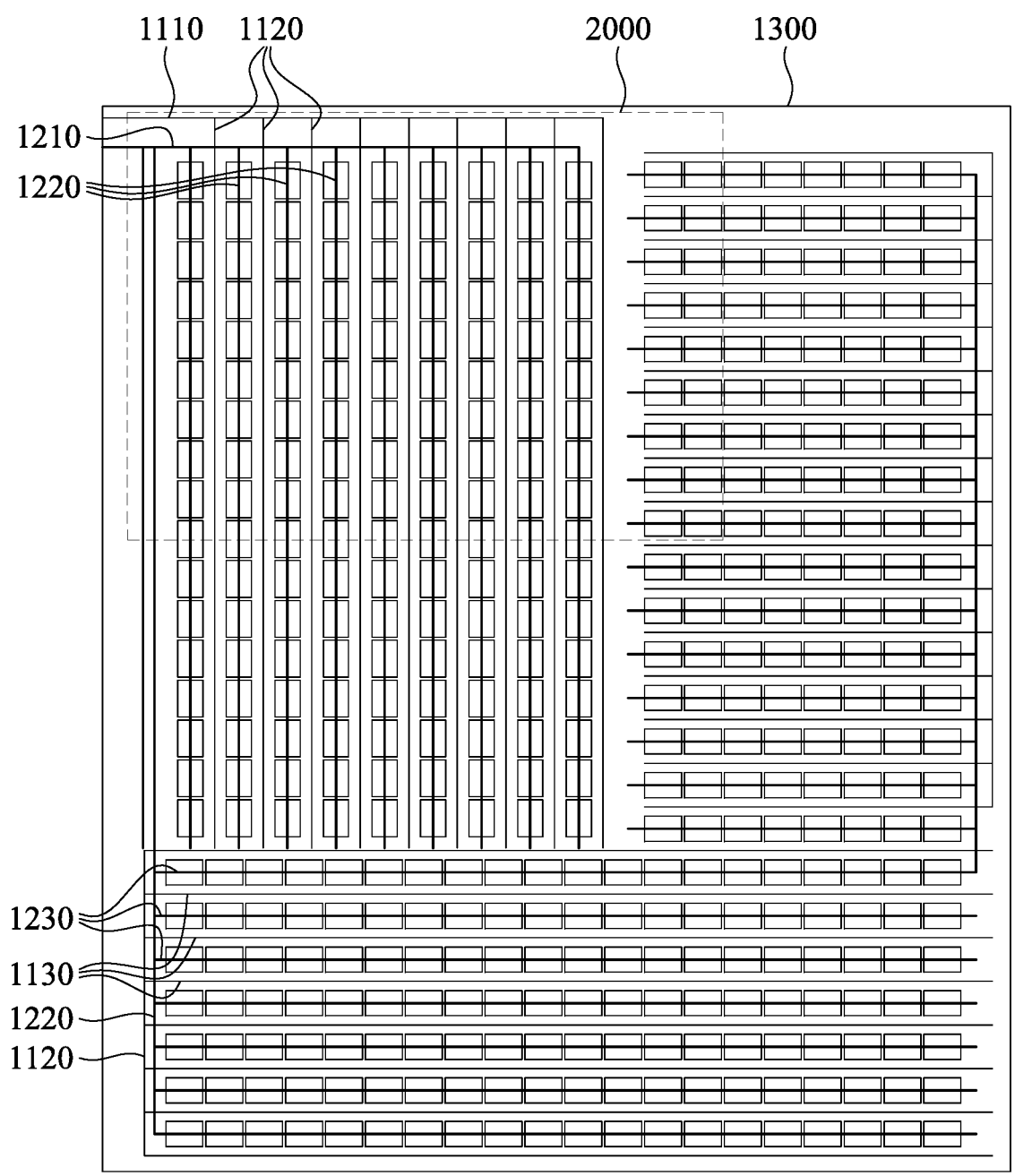
FIG. 1 depicts a schematic diagram of a patterned ground shield device according to one embodiment of the present disclosure.

FIG. 1 depicts a schematic diagram of a patterned ground shield device 1000 according to one embodiment of the present disclosure. As shown in FIG. 1, the patterned ground shield device 1000 includes a first patterned ground shield layer and a second patterned ground shield layer. The first patterned ground shield layer is located on a first layer, and the first patterned ground shield layer includes a plurality of first strip-shaped structures 1100. Each of the first strip-shaped structures 1100 includes an oxide diffusion material (OD).

In addition, the second patterned ground shield layer is located on a second layer, and the second patterned ground shield layer includes a plurality of second strip-shaped structures 1200. Each of the second strip-shaped structures 1200 includes a conductive material. Besides, with respect to structures, the first strip-shaped structures 1100 and the second strip-shaped structures 1200 are disposed to each other in an interlaced manner.

For example, the second patterned ground shield layer can be a conventional patterned ground shield (PGS). Therefore, the second strip-shaped structures 1200 of the PGS can be metal structures. Furthermore, the first patterned ground shield layer can be formed by a diffusion region (OD) of the substrate 1300. Therefore, the first strip-shaped structures 1100 can be implemented by the diffusion region (OD). The second patterned ground shield layer (e.g., formed by the strip-shaped structures 1200) may prevent eddy currents from generating on the substrate owing to the inductor during operating, such that the Q value of the inductor will not be effected. In addition, even if there are a little eddy currents generated on the substrate during the inductor operating, the first patterned ground shield layer (e.g., formed by the strip-shaped structures 1100) formed in the diffusion region (OD) of the substrate 1300 can make the eddy currents hard to flow, such that the quality factor of the inductor can be further enhanced.

In one embodiment, a portion of the first strip-shaped structures are disposed in a first direction, and a portion of the second strip-shaped structures are disposed in the first direction. For example, a portion of the first strip-shaped structures 1120 are disposed in a Y direction, and a portion of the second strip-shaped structures 1220 are also disposed in the Y direction.

In one embodiment, the first strip-shaped structures which are disposed in the first direction and the second strip-shaped structures which are disposed in the first direction are disposed to each other in an interlaced manner. For example, the first strip-shaped structures 1120 which are disposed in the Y direction and the second strip-shaped structures 1220 which are disposed in the Y direction are disposed to each other in an interlaced manner. Specifically, in the Y direction, a disposition sequence of the first strip-shaped structures 1120 and the second strip-shaped structures 1220 is that the first strip-shaped structure 1120, the second strip-shaped structure 1220, the first strip-shaped structure 1120, and the second strip-shaped structure 1220.

In one embodiment, a portion of the first strip-shaped structures are disposed in a second direction, and a portion of the second strip-shaped structures are disposed in the second direction. For example, a portion of the first strip-shaped structures 1130 are disposed in a X direction, and a portion of the second strip-shaped structures 1230 are disposed in the X direction.

In one embodiment, the first strip-shaped structures which are disposed in the second direction and the second strip-shaped structures which are disposed in the second direction are disposed to each other in an interlaced manner. For example, the first strip-shaped structures 1130 which are disposed in the X direction and the second strip-shaped structures 1230 which are disposed in the X direction are disposed to each other in an interlaced manner. Specifically, in the X direction, a disposition sequence of the first strip-shaped structures 1130 and the second strip-shaped structures 1230 is that the first strip-shaped structure 1130, the second strip-shaped structure 1230, the first strip-shaped structure 1130, and the second strip-shaped structure 1230.

In one embodiment, the first direction is perpendicular to the second direction. For example, the X direction is perpendicular to the Y direction.

In one embodiment, a first line width of each of the first strip-shaped structures 1100 is different from a second line width of the second strip-shaped structures 1200. In another embodiment, the second line width of each of the second strip-shaped structures 1200 is larger than the first line width of the first strip-shaped structures 1100. In practical, the line width of one of the second strip-shaped structures 1200 can be many times larger than the line width of one of the first strip-shaped structures 1100.

In one embodiment, the first layer is different from the second layer. It is noted that the present disclosure is not limited to the structure as shown in FIG. 1, and it is merely an example for illustrating one of the implements of the present disclosure.

Figure 2:
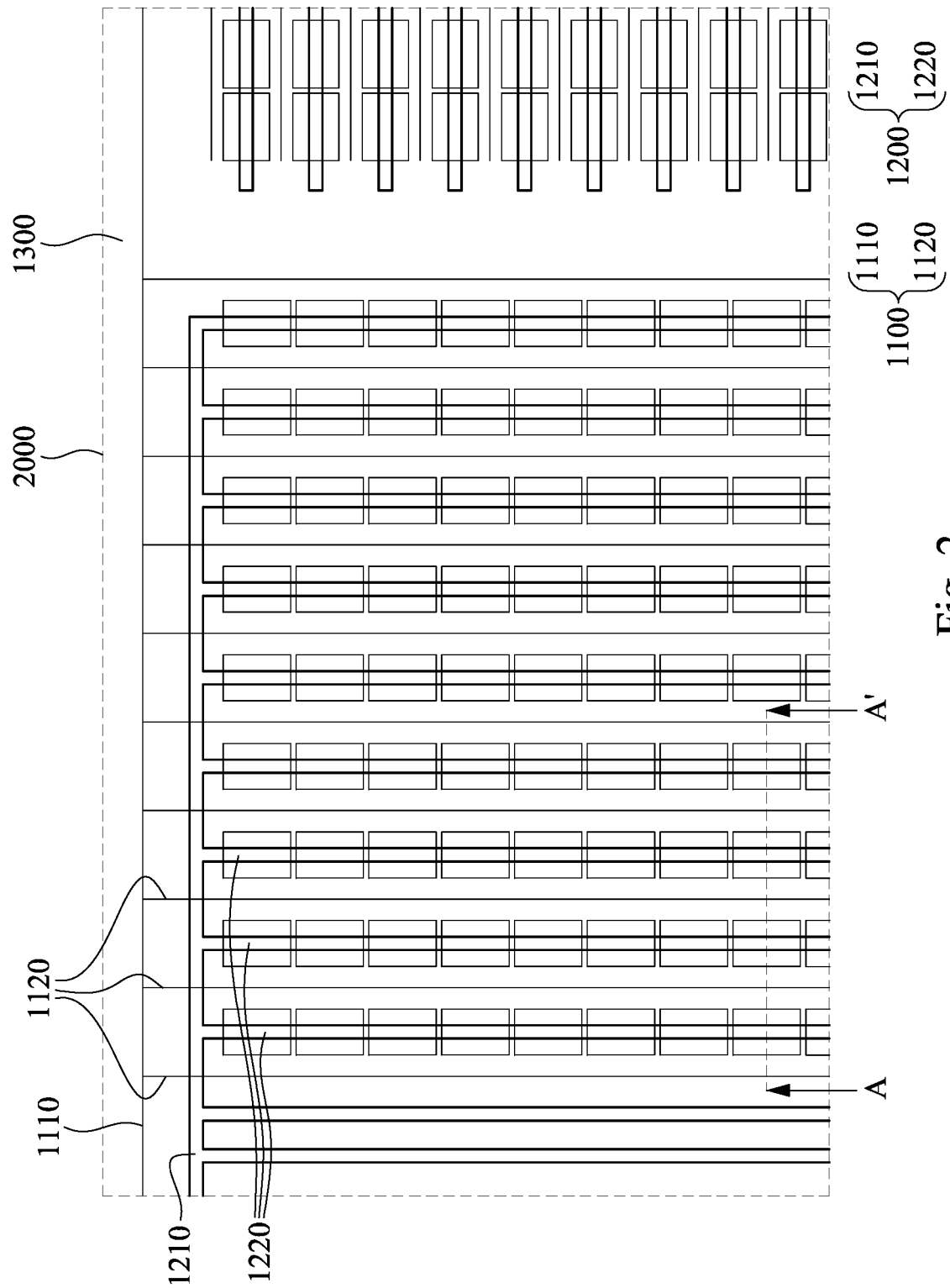
FIG. 2 depicts a schematic diagram of a partial structure of the patterned ground shield device as shown in FIG. 1 according to one embodiment of the present disclosure.

FIG. 2 depicts a schematic diagram of a partial structure 2000 of the patterned ground shield device 1000 as shown in FIG. 1 according to one embodiment of the present disclosure. As shown in the figure, the first strip-shaped structures 1100 include a first trunk 1110 and a plurality of first branches 1120. The first branches 1120 are coupled to the first trunk 1110. In one embodiment, the first trunk 1110 is perpendicular to the first branches 1120.

In one embodiment, the second strip-shaped structures 1200 include a second trunk 1210 and a plurality of second branches 1220. The second branches 1220 are coupled to the second trunk 1210. In one embodiment, the second trunk 1210 is perpendicular to the second branches 1220.

In one embodiment, the first trunk 1110 and the second trunk 1210 are disposed to each other in an interlaced manner. In addition, the first branches 1120 and the second branches 1220 are disposed to each other in an interlaced manner. Specifically, a disposition sequence of the first branches 1120 and the second branches 1220 is that the first branch 1120, the second branch 1220, the first branch 1120, and the second branch 1220. It is noted that the present disclosure is not limited to the structure as shown in FIG. 2, and it is merely an example for illustrating one of the implements of the present disclosure.

Please referring back to FIG. 1, one of the first branches 1120 can be regard as the first sub-trunk. In addition, the first strip-shaped structures 1100 further include a plurality of first sub-branches 1130. For example, the first branch 1120 located at the far left among the first branches 1120 in the figure is regard as the first sub-trunk, and the first sub-branch 1130 located at the lower side among the first sub-branches 1130 in the figure is coupled to the first sub-trunk 1120. With respect to the structures, the first sub-branches 1130 are perpendicular to the first branches 1120. In addition, the first sub-branches 1130 and the first trunk 1110 are disposed to each other in parallel.

In one embodiment, one of the second branches 1220 can be regard as the second sub-trunk. In addition, the second strip-shaped structures 1200 further include a plurality of second sub-branches 1230. For example, the second branch 1220 located at the far left side among the second branches 1220 in the figure is regard as the second sub-trunk, and the second sub-branch 1230 located at the lower side among the second sub-branches 1230 in the figure is coupled to the second sub-trunk 1220. With respect to the structures, the second sub-branches 1230 are perpendicular to the second branches 1220. In addition, the second sub-branches 1230 and the second trunk 1210 are disposed to each other in parallel.

Figure 3:
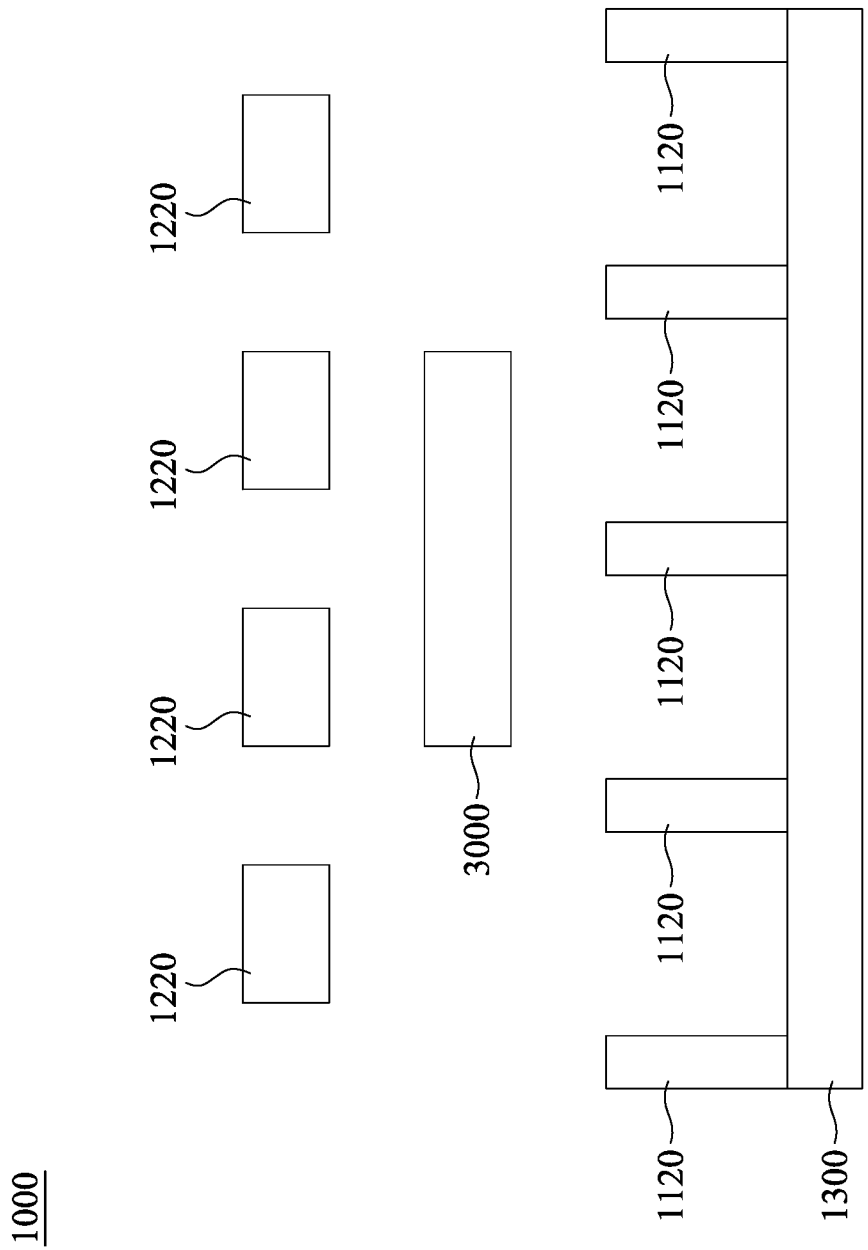
FIG. 3 depicts a cross-sectional diagram of the partial structure of the patterned ground shield device as shown in FIG. 2 according to one embodiment of the present disclosure.

FIG. 3 depicts a cross-sectional diagram along AA' line of the partial structure 2000 of the patterned ground shield device 1000 as shown in FIG. 2 according to one embodiment of the present disclosure. As shown in the figure, the first strip-shaped structures 1120 of the first patterned ground shield layer can be disposed on the substrate 1300. In addition, the second strip-shaped structures 1220 of the second patterned ground shield layer can be disposed above the first strip-shaped structures 1120 of the first patterned ground shield layer, and the first strip-shaped structures 1120 and the second strip-shaped structures 1220 are disposed to each other in an interlaced manner. Besides, a position, between the first patterned ground shield layer and the second patterned ground shield layer of the patterned ground shield device 1000 of the present disclosure, can be used to dispose other device 3000 depending on actual requirements. It is noted that the present disclosure is not limited to the structure as shown in FIG. 3, and it is merely an example for illustrating one of the implements of the present disclosure.

Figure 4:
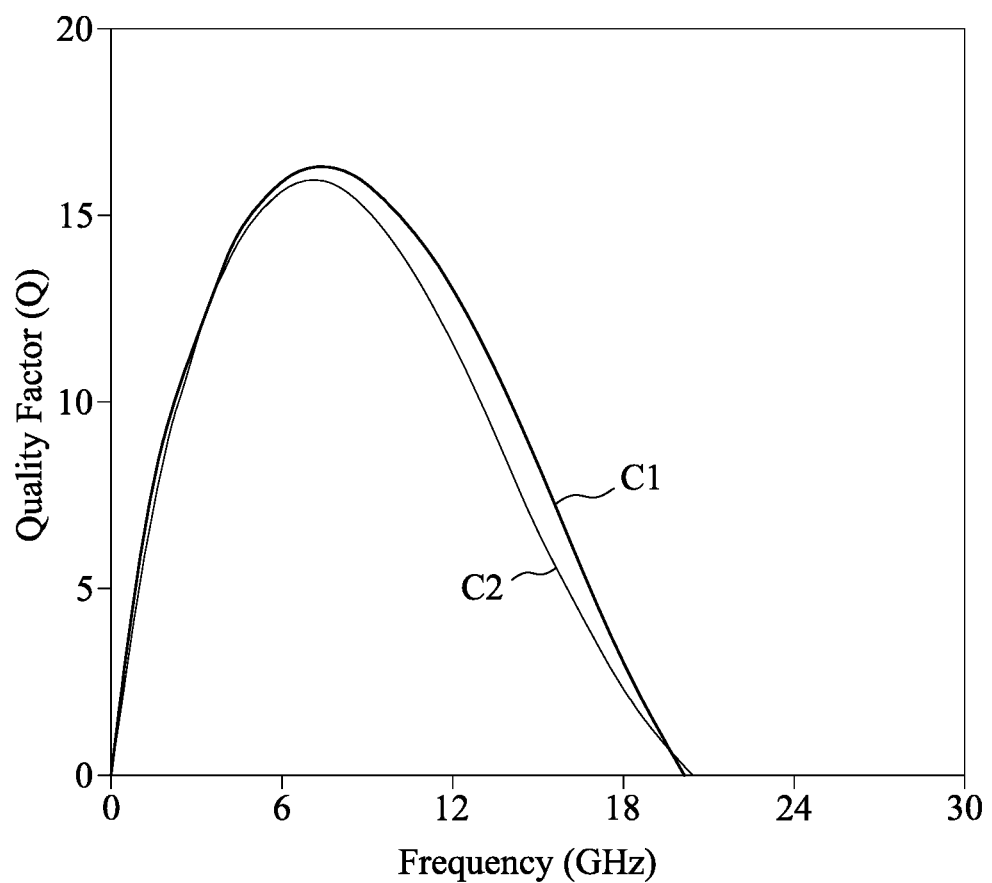
FIG. 4 depicts a schematic diagram of experimental data of a patterned ground shield device according to one embodiment of the present disclosure.

FIG. 4 depicts a schematic diagram of experimental data of the patterned ground shield device 1000 as shown in FIG. 1 according to one embodiment of the present disclosure. As shown in the figure, the experimental curve of the quality factor of the integrated device adopting the structural configuration of the patterned ground shield device 1000 of the present disclosure is C1. Besides, the experimental curve of the quality factor of the integrated device which does not adopt the structural configuration of the patterned ground shield device 1000 of the present disclosure is C2. As can be seen from the figure, the integrated device adopting the structural configuration of the patterned ground shield device 1000 of the present disclosure has better quality factor. For example, at a frequency of about 7.5 GHz, the best quality factor of the integrated device is 17.01.

It can be understood from the embodiments of the present disclosure that application of the present disclosure has the following advantages. The patterned ground shield device of the embodiment of the present disclosure may restrain eddy currents generated on the substrate so as to enhance the quality factor of the integrated inductor. The principle of the present disclosure is to use the original pattern ground shield (PGS), for example, the strip-shaped structures 1210, 1220 as shown in FIG. 1, to be a first protection in a form of a layer. In addition, the present disclosure further constructs a second PGS at the lower layer, for example, the strip-shaped structures 1110, 1120 as shown in FIG. 1, to be a second protection in a form of a layer, so as to further prevent eddy currents from generating on the substrate owing to the magnetic field.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A patterned ground shield device, comprising:
   a first patterned ground shield layer located on a first layer, comprising:
   a plurality of first strip-shaped structures, each of the plurality of first strip-shaped structures comprises an oxide diffusion material; and
   a second patterned ground shield layer located on a second layer, comprising:
   a plurality of second strip-shaped structures, each of the plurality of second strip-shaped structures comprises a conductive material, wherein the plurality of first strip-shaped structures and the plurality of second strip-shaped structures are disposed to each other in an interlaced manner, wherein a second line width of each of the plurality of second strip-shaped structures is at least two times larger than a first line width of each of the plurality of first strip-shaped structures.

2. The patterned ground shield device of claim 1, wherein a portion of the plurality of first strip-shaped structures are disposed in a first direction, and a portion of the plurality of second strip-shaped structures are disposed in the first direction.

3. The patterned ground shield device of claim 2, wherein the plurality of first strip-shaped structures which are disposed in the first direction and the plurality of second strip-shaped structures which are disposed in the first direction are disposed to each other in an interlaced manner.

4. The patterned ground shield device of claim 3, wherein in the first direction, a disposition sequence of the plurality of first strip-shaped structures and the plurality of second strip-shaped structures is that a first strip-shaped structure, a second strip-shaped structure, the first strip-shaped structure, and the second strip-shaped structure.

5. The patterned ground shield device of claim 4, wherein a portion of the plurality of first strip-shaped structures are disposed in a second direction, and a portion of the plurality of second strip-shaped structures are disposed in the second direction.

6. The patterned ground shield device of claim 5, wherein the plurality of first strip-shaped structures which are disposed in the second direction and the plurality of second strip-shaped structures which are disposed in the second direction are disposed to each other in an interlaced manner.

7. The patterned ground shield device of claim 6, wherein in the second direction, a disposition sequence of the plurality of first strip-shaped structures and the plurality of second strip-shaped structures is that the first strip-shaped structure, the second strip-shaped structure, the first strip-shaped structure, and the second strip-shaped structure.

8. The patterned ground shield device of claim 7, wherein the first direction is perpendicular to the second direction.

9. The patterned ground shield device of claim 1, further comprising:
   a substrate, wherein the plurality of first strip-shaped structures are disposed on the substrate.

10. The patterned ground shield device of claim 1, wherein the first layer and the second layer are different layers.

11. The patterned ground shield device of claim 1, wherein the plurality of first strip-shaped structures comprise:
- a first trunk; and
- a plurality of first branches coupled to the first trunk.

12. The patterned ground shield device of claim 11, wherein the first trunk is perpendicular to the plurality of first branches.

13. The patterned ground shield device of claim 12, wherein the plurality of second strip-shaped structures comprise:
- a second trunk; and
- a plurality of second branches coupled to the second trunk.

14. The patterned ground shield device of claim 13, wherein the second trunk is perpendicular to the plurality of second branches.

15. The patterned ground shield device of claim 14, wherein the first trunk and the second trunk are disposed to each other in an interlaced manner.

16. The patterned ground shield device of claim 15, wherein the plurality of first branches and the plurality of second branches are disposed to each other in an interlaced manner.

17. The patterned ground shield device of claim 16, wherein one of the plurality of first branches is regard as a first sub-trunk, wherein the plurality of first strip-shaped structures further comprise:
- a plurality of first sub-branches coupled to the first sub-trunk, wherein the plurality of first sub-branches are perpendicular to the plurality of first branches, and the plurality of first sub-branches and the first trunk are disposed to each other in parallel.

18. The patterned ground shield device of claim 17, wherein one of the plurality of second branches is regard as a second sub-trunk, wherein the plurality of second strip-shaped structures further comprise:
- a plurality of second sub-branches coupled to the second sub-trunk, wherein the plurality of second sub-branches are perpendicular to the plurality of second branches, and the second sub-branches and the second trunk are disposed to each other in parallel.

* * * * *